United States Patent
Iwasa et al.

(10) Patent No.: US 8,693,151 B2
(45) Date of Patent: Apr. 8, 2014

(54) DIFFERENTIAL TRANSMISSION CIRCUIT AND ELECTRONIC DEVICE PROVIDED WITH THE SAME

(75) Inventors: Masaharu Iwasa, Kanagawa (JP); Tomohiro Yamada, Kangawa (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/146,423

(22) PCT Filed: Jan. 28, 2010

(86) PCT No.: PCT/JP2010/000514
§ 371 (c)(1),
(2), (4) Date: Jul. 27, 2011

(87) PCT Pub. No.: WO2010/087184
PCT Pub. Date: Aug. 5, 2010

(65) Prior Publication Data
US 2011/0279935 A1    Nov. 17, 2011

(30) Foreign Application Priority Data
Jan. 29, 2009    (JP) .................................. 2009-017563

(51) Int. Cl.
*H02H 9/04*    (2006.01)
(52) U.S. Cl.
USPC .......................................................... 361/56
(58) Field of Classification Search
USPC .......................................................... 361/56
See application file for complete search history.

(56) References Cited

U.S. PATENT DOCUMENTS

| | | | | |
|---|---|---|---|---|
| 4,823,383 A | * | 4/1989 | Cardot et al. | 379/412 |
| 4,876,584 A | * | 10/1989 | Taylor | 257/358 |
| 5,327,319 A | * | 7/1994 | Lee et al. | 361/118 |
| 5,969,929 A | * | 10/1999 | Kleveland et al. | 361/111 |

(Continued)

FOREIGN PATENT DOCUMENTS

| CN | 102510210 A | * | 6/2010 |
|---|---|---|---|
| JP | 58-70675 A | | 4/1983 |

(Continued)

OTHER PUBLICATIONS

International Search Report for Application No. PCT/JP2010/000514., Apr. 13, 2010, Panasonic Corporation.

(Continued)

*Primary Examiner* — Jared Fureman
*Assistant Examiner* — Angela Brooks
(74) *Attorney, Agent, or Firm* — RatnerPrestia

(57) ABSTRACT

A differential transmission circuit is capable of realizing a high resistance to electrostatic breakdown without deteriorating a transmission signal. The differential transmission circuit includes ESD protection elements connected between transmission lines and a ground, respectively, a common mode filter in which an inductor element is serially connected between transmission lines, and an inductor element serially connected between transmission lines are magnetically coupled to each other, ESD protection diodes of which cathodes are connected to transmission, respectively, and anodes thereof connected to grounds, respectively, and resistors of which one side terminals are connected to transmission lines, respectively, and the other side terminals thereof are connected to transmission lines, respectively. Resistance values of the resistors are set to 10 to 15 ohms, respectively, electrostatic capacitance values of the ESD protection elements are less than 0.3 pF, respectively, and a clip voltage of each of the ESD protection diodes is set to a value less than 10 V.

3 Claims, 12 Drawing Sheets

(56) References Cited

U.S. PATENT DOCUMENTS

| | | | | |
|---|---|---|---|---|
| 6,288,917 | B1* | 9/2001 | Redburn et al. | 363/39 |
| 6,459,343 | B1* | 10/2002 | Miller | 333/32 |
| 6,826,208 | B1* | 11/2004 | Birk | 372/25 |
| 7,019,382 | B2* | 3/2006 | Litwin et al. | 257/546 |
| 7,151,298 | B1* | 12/2006 | Eggert et al. | 257/355 |
| 8,422,189 | B2* | 4/2013 | Wang | 361/118 |
| 2004/0124940 | A1* | 7/2004 | Ryu et al. | 333/12 |
| 2005/0219006 | A1 | 10/2005 | Suenaga et al. | |
| 2007/0188266 | A1 | 8/2007 | Kebinger et al. | |
| 2007/0279147 | A1* | 12/2007 | Dupont et al. | 333/109 |
| 2009/0261897 | A1* | 10/2009 | Bobde | 327/552 |
| 2010/0084551 | A1 | 4/2010 | Kawato | |
| 2012/0200963 | A1* | 8/2012 | Vasquez et al. | 361/56 |
| 2012/0275074 | A1* | 11/2012 | Dill et al. | 361/56 |
| 2012/0314328 | A1* | 12/2012 | Dill et al. | 361/56 |

FOREIGN PATENT DOCUMENTS

| | | | |
|---|---|---|---|
| JP | 2005-318539 | A | 11/2005 |
| JP | 2005-333427 | A | 12/2005 |
| JP | 2008-028214 | A | 2/2008 |
| JP | 2009-004466 | A | 1/2009 |
| WO | WO 2008/053555 | A1 | 5/2008 |

OTHER PUBLICATIONS

J. Lepkowski et al.; EMI/ESD Solutions for the CAN Network; Networking, Sensing and Control, 2005; Proceedings; 2005 IEEE; Tucson, AZ; Mar. 19-22, 2005; Piscataway, NJ; pp. 413-418.

Supplementary European Search Report for EP 10 73 5656, Feb. 21, 2013.

* cited by examiner

FIG. 4

| | HUMAN BODY MODEL (HBM) EIAJ ED-4701/304 | GENERAL APPARATUS IEC61000-4-2 (LEVEL 3) | ON-VEHICLE APPARATUS ISO-TR-10605 |
|---|---|---|---|
| DISCHARGE VOLTAGE (HIGH VOLTAGE SOURCE V) | CONTACT DISCHARGE 2kV (GENERAL SEMICONDUCTOR) | AERIAL DISCHARGE 8kV CONTACT DISCHARGE 4kV | AERIAL DISCHARGE 15kV CONTACT DISCHARGE 8kV |
| DISCHARGE RESISTOR Rd | 1500Ω | 330Ω | 2000Ω |
| ENERGY STORAGE CAPACITOR Cs | 100pF | 150pF | 330pF |
| CHARGE RESISTOR Rc | | 50 ~ 100MΩ | |

DIFFERENTIAL TRANSMISSION CIRCUIT AND ELECTRONIC DEVICE PROVIDED WITH THE SAME

This application is a U.S. National Phase Application of PCT International Application PCT/JP2010/000514.

TECHNICAL FIELD

The present invention relates to a differential transmission circuit that is used for protecting an electronic apparatus including a high-speed signal transmission circuit such as an HDMI (High-Definition Multimedia Interface) from static electricity, and an electronic device including the differential circuit.

BACKGROUND ART

In recent years, along with higher performance and higher functionality in regard to digital apparatuses, increases in data transmission speeds and increases in bandwidth have been progressing quickly. To cope with this, standards for a high-speed data transmission beginning with an HDMI have been spreading quickly.

In addition, as represented by a portable apparatus, a mobile phone, an in-vehicle apparatus, or the like, the locations at which these apparatuses are used have increased regardless of being indoors or outdoors, and therefore higher reliability compared to the related art is required. However, in regard to a semiconductor component such as an IC (Integrated Circuit) and an LSI (Large Scale Integration), the miniaturization of circuits has proceeded year by year in order to realize miniaturization and a high-speed operation, and therefore resistance to static electricity entering from the outside is decreased. This has a significant effect regarding a decrease in the scale of embeddable protection elements, in addition to a decrease in the resistance property of the semiconductor itself.

In general, protection diodes are provided immediately after an input and output terminal of the LSI, and due to a function thereof, an internal circuit is protected from an external static pulse or the like. The protection diodes are instantly turned on when a voltage of a certain value or more is applied thereto and routes the current to a ground. When the protection diodes are connected in a multi-stage manner, the amount of current made to flow into the LSI is increased, and therefore, a predetermined resistance to electrostatic breakdown is secured. However, in terms of the configuration of these protection diodes, each of them maintains a capacitance component, such that the capacitance value becomes large when the protection diodes are connected in a multi-stage manner, and therefore this configuration has an adverse effect on a signal of a high-frequency band. Therefore, in the LSI used in a high-speed transmission line or the like, the protection elements that can be embedded are restricted, and accordingly, the resistance to the electrostatic breakdown is deteriorated.

As shown in FIG. 18, an electrostatic breakdown protection circuit 100 in the related art, which is used for these uses, includes a first transmission line 103 connected to a first input and output terminal 101, a second transmission line 104 connected to a second input and output terminal 102, a first ESD (ElectroStatic Discharge) protection element 105 connected between the first transmission line 103 and a ground, and a second ESD protection element 106 connected between the second transmission line 104 and a ground. A differential transmission circuit in the related art further includes a common mode filter 109 in which a first inductor element 107 serially connected between the first transmission 103 and a third transmission line 110 connected to a third input and output terminal 118, and a second inductor element 108 serially connected between the second transmission line 104 and a fourth transmission line connected to a fourth input and output terminal 119 are magnetically coupled to each other.

In this configuration, as the first and second ESD protection elements 105 and 106, an ESD suppressor or the like is used. The ESD suppressor has a low capacitance value of substantially 0.1 to 0.3 pF compared to, for example, a varistor, a zener diode, or the like, such that even when used in a high transmission line, the ESD suppressor does not disturb a defined characteristic impedance, and accordingly, it is possible to make the adverse effect on the signal of a high-frequency band as small as possible (for example, refer to PTL 1).

CITATION LIST

Patent Literature

[PTL 1] JP-A-2008-28214 (page 8, FIG. 9)

SUMMARY OF INVENTION

Technical Problem

However, in regard to the differential transmission circuit in the related art, only a low-capacitance protection element such as the ESD suppressor as a protection element is used, such that the magnitude of the electrostatic pulse that can be suppressed is limited.

In addition, according to the differential transmission circuit of the related art, a capacitance component applied to the transmission line can be suppressed to the minimum, but a clip voltage value immediately after discharge initiation becomes large, such that the value of the current that flows into the protection element embedded in the LSI becomes large. In the LSI used in the high-speed transmission line or the like, the protection element that can be embedded is limited, such that it is necessary to add an external protection circuit, which is more effective, with respect to an electrostatic pulse stronger than that in the related art. A static electricity test of a general AV (Audio Visual) apparatus is defined in IEC 61000-4-2, but in an in-vehicle apparatus or the like, the test is required to be performed under stricter conditions using a separate standard (ISO-TR-10164).

The invention is made in consideration of the above-described problems, and an object of the invention is to provide a differential transmission circuit capable of realizing a high resistance to electrostatic breakdown without deteriorating a transmission signal, and an electronic device including the differential transmission circuit.

Solution to Problem

To achieve the above-described object, a differential transmission circuit according to the invention includes a first ESD protection element connected between a first transmission line and a ground; a second ESD protection element connected between a second transmission line and a ground; a common mode filter that includes a first inductor element and a second inductor element which are magnetically coupled to each other, wherein the first inductor element is serially connected between the first transmission and a third transmission line and the second inductor element is serially connected between the second transmission line and a fourth transmission line; a first ESD protection diode of which a cathode is connected to the third transmission line and of which an anode is connected to a ground; a second ESD protection diode of which a cathode is connected to the fourth transmission line and of which an anode is connected to a ground; a first resistor of which one terminal is connected to the third transmission line and of which the other terminal is connected to a fifth transmission line; and a second resistor of which one terminal is connected to the fourth terminal and of which the other terminal is connected to a sixth transmission line. Resistance values of the first and second resistors are set to 10 to 15 ohms, respectively, electrostatic capacitance values of the first and second ESD protection elements are less than 0.3 pF, respectively, and a clip voltage of each of the first and second ESD protection diodes is set to a value less than 10 V.

In addition, an electronic device according to the invention includes the above-described transmission circuit.

Advantageous Effects of Invention

According to the differential transmission circuit and the electronic device including the differential transmission circuit, a part of a current of an electrostatic pulse applied to the first and second transmission lines is routed to the ground by the first and second ESD protection elements. In addition, a current of an electrostatic pulse, which is not completely dropped by the first and second ESD protection elements, is bypassed to the ground by the first and second ESD protection diodes provided at a subsequent stage, and it is possible to suppress a current from flowing into a load (for example, LSI) connected to the first and second resistors by the first and second resistors provided at a further subsequent stage.

Due to the above-described operation, it is possible to provide a differential transmission circuit capable of securing a high resistance to electrostatic breakdown while suppressing deterioration of a transmission signal in a high-speed transmission circuit to the minimum, and an electronic device including the differential transmission circuit.

BRIEF DESCRIPTION OF DRAWINGS

FIG. 4 is a diagram exemplifying a value of each element in the equivalent circuit shown in FIG. 3.

DESCRIPTION OF EMBODIMENTS

Hereinafter, a differential transmission circuit according to an embodiment of the invention will be described using FIGS. 1 to 9.

Figure 1:
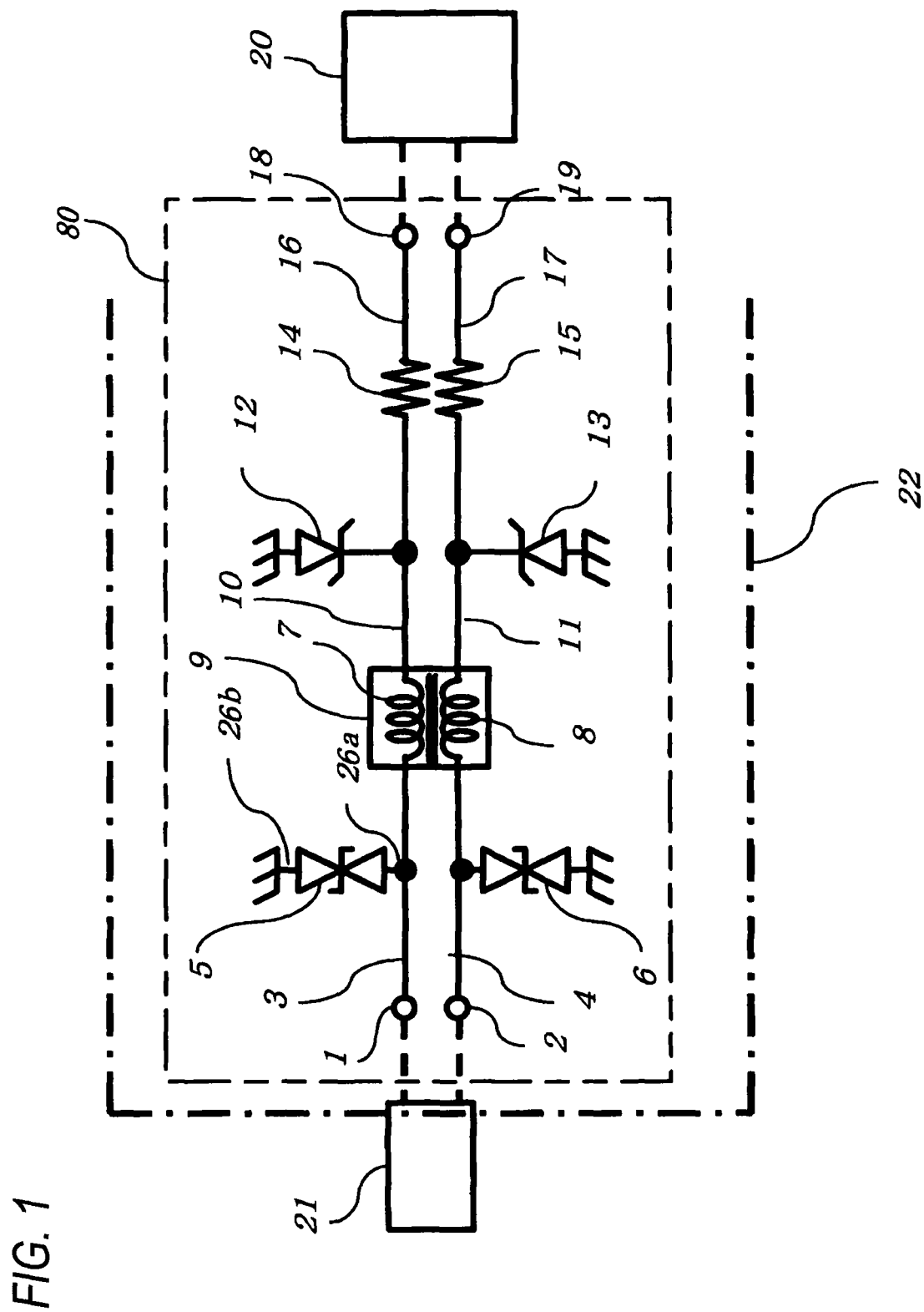
FIG. 1 is a schematic diagram illustrating a configuration of a differential transmission circuit 80 according to a first embodiment of the invention.

FIG. 1 shows a schematic diagram illustrating a configuration of a differential transmission circuit 80 according to an embodiment of the invention.

As shown in FIG. 1, the differential transmission circuit 80 is accommodated in a first transmission and reception apparatus 22 such as a digital TV, and includes a first transmission line 3 connected to a first input and output terminal 1, a second transmission line 4 connected to a second input and output terminal 2, a first ESD protection element 5 connected between the first transmission line 3 and a ground, and a second ESD protection element 6 connected between the second transmission line 4 and a ground. Electrostatic capacitance values of the first and second ESD protection elements 5 and 6 are selected to be substantially 0.3 pF or less.

The differential transmission circuit 80 further includes a common mode filter 9 in which a first inductor element 7 serially connected between the first transmission line 3 and a third transmission line 10, and a second inductor element 8 serially connected between the second transmission line 4 and a fourth transmission line 11 are magnetically coupled to each other.

The differential transmission circuit 80 further includes a first ESD protection diode 12 of which a cathode is connected to the third transmission line 10 and an anode is connected to a ground, and a second ESD protection diode 13 of which a cathode is connected to the fourth transmission line 11 and an anode is connected to a ground.

The differential transmission circuit 80 further includes a first resistor 14 of which one terminal is connected to the third transmission line 10, a second resistor 15 of which one terminal is connected to the fourth transmission line 11, a fifth transmission line 16 connected to a third input and output terminal 18 to which the other terminal of the first resistor 14 is connected, and a sixth transmission line 17 connected to a fourth input and output terminal 19 to which the other terminal of the second resistor 15 is connected. Here, resistance values of the first and second resistors 14 and 15 are selected within a range of substantially 10 to 15 ohms.

In the above-described configuration, the third input and output terminal 18 and the fourth input and output terminal 19 are connected to an LSI 20 as one example of a load, and the first input and output terminal 1 and the second input and output terminal 2 are connected to an external connector 21.

Figure 2:
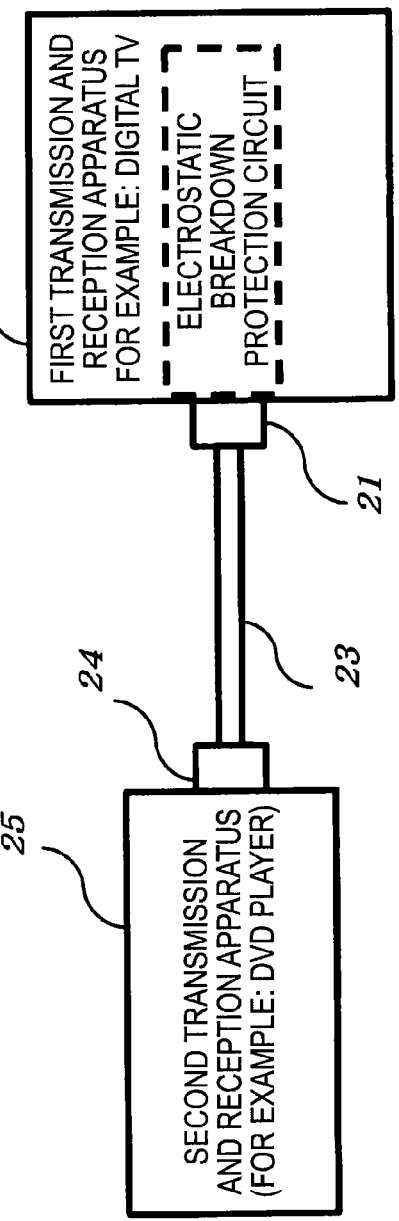
FIG. 2 is a schematic diagram illustrating a usage environment of the differential transmission circuit 80 shown in FIG. 1.

Here, FIG. 2 shows a schematic diagram illustrating a usage environment of the differential transmission circuit 80 shown in FIG. 1. As shown in FIG. 2, an external connecter 21 of one side, which is connected to the first transmission and reception apparatus 22, is connected to a second transmission and reception apparatus 25 through an external connecter 24 of the other side, which is connected to a transmission cable 23.

Here, the first transmission and reception apparatus 22 and the second transmission and reception apparatus 25 are, for example, a digital TV and a DVD player, and the transmission cable 23 is, for example, an HDMI cable.

The differential transmission circuit 80 of this embodiment is provided as a part of an input and output circuit of the first transmission and reception apparatus 22, and prevents a breakdown of the apparatus due to an electrostatic pulse applied through the transmission cable. In addition, similarly, the same circuit as described above may be provided to the second transmission and reception apparatus 25.

Figure 10:
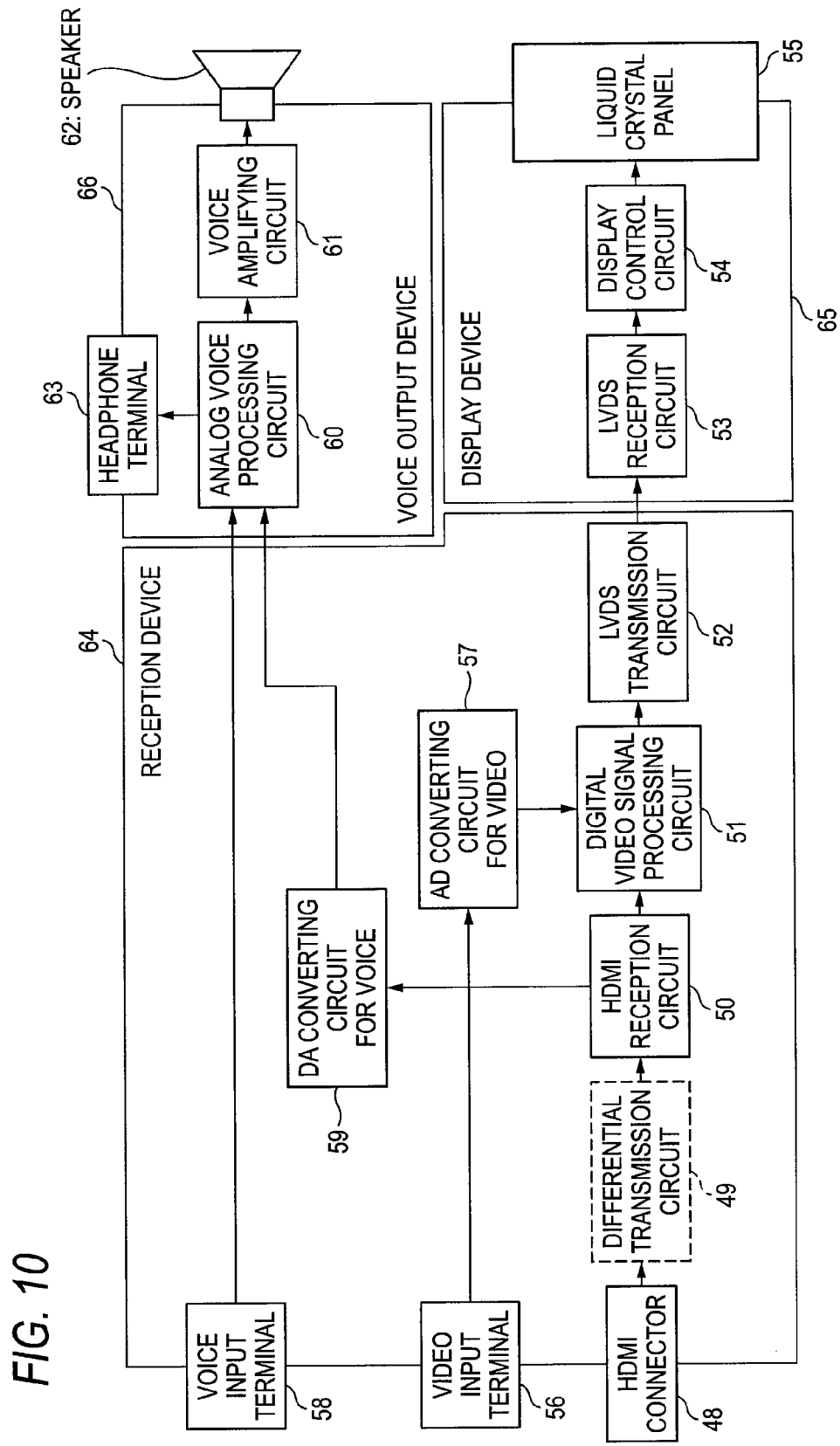
FIG. 10 is an inner configuration diagram of an in-vehicle display monitor including the differential transmission circuit of the present invention.

Here, a usage example of the differential transmission circuit 80 of this embodiment will be described in more detail by using FIG. 10. FIG. 10 shows an internal configuration diagram of an in-vehicle display monitor including an HDMI connector 48.

The in-vehicle display monitor shown in FIG. 10 includes a display device 65, a voice output device 66, and a reception device 64.

The reception device 64 includes the HDMI connector 48, a differential transmission circuit 49, an HDMI reception circuit 50, a digital video signal processing circuit 51, an LVDS transmission circuit 52, a video input terminal 56, a voice input terminal 58, an AD converting circuit 57 for a video, a DA converting circuit 59 for a voice.

The voice output device 66 includes an analog voice processing circuit 60, a voice amplifying circuit 61, a speaker 62, and a headphone terminal 63.

The display device 65 includes an LVDS reception circuit 53, a display control circuit 54, and a liquid crystal panel 55.

Here, in the in-vehicle display monitor including the HDMI connector 48 shown in FIG. 10, the differential transmission circuit 49 corresponds to the differential transmission circuit 80 of this embodiment.

In FIG. 10, a video signal and a voice signal are input to the HDMI connector 48 from an externally connected apparatus such as a DVD player, or a Blue-ray disc player. This signal is an encrypted differential signal that is called TMDS, and is input to the HDMI reception circuit 50 through the differential transmission circuit 49.

The HDMI reception circuit 50 decrypts a secret code of the input TMDS signal, separates a digital video signal and a digital voice signal, and outputs the audio signal and voice signal to the digital video signal processing circuit 51 and the DA converting circuit 59 for a voice, respectively.

The digital video signal is subjected to an image processing by the digital video signal processing circuit 51, is converted to an LVDS signal by the LVDS transmission circuit 52, and is transmitted to the display device 65.

The display device 65 receives the LVDS signal according to the LVDS reception circuit 53, and displays the received signal to the liquid crystal panel 55 using the display control circuit 54.

On the other hand, the digital voice signal output from the above-described HDMI reception circuit 50 is converted into an analog voice by the DA converting circuit 59 for a voice, and is input to the voice output device 66.

In the voice output device 66, a voice processing is performed by the analog voice processing circuit 60, and the processed voice is output to the voice amplifying circuit 61 for the output from the headphone terminal 63 or the speaker 62.

The reception device 64 includes the video input terminal 56 and the voice input terminal 58 as additional external input terminals.

An analog video signal is input to the video input terminal 56 from the outside, is digital-converted by the AD converting circuit 57 for a video, and is input to the above-described digital video signal processing circuit 51.

This signal is digital-processed together with the video transmitted from the above-described HDMI connector 48, and is output to a subsequent stage.

On the other hand, an analog voice input is input to the voice input terminal 58 from the outside, and is input to the analog voice processing circuit 60.

In regard to breakdowns due to static electricity, a test standard is defined by assuming a case where a human body comes into contact with an apparatus, and a test method defined in IEC 61000-4-2 which is an international standard is generally used, but there are other separate standards based on this which are defined according to usage.

Figure 3:
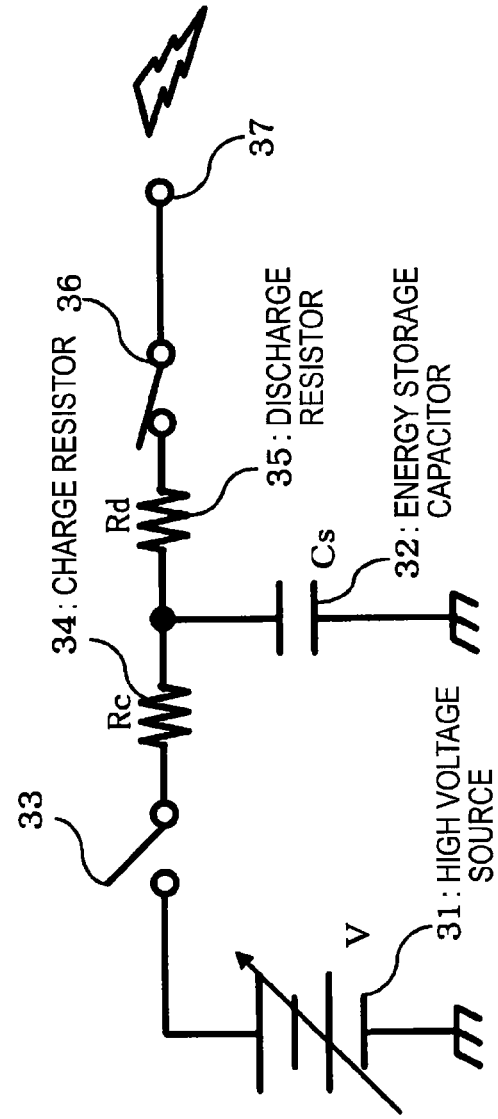
FIG. 3 is a schematic diagram illustrating an equivalent circuit of a discharge device that is used in an ESD test.

FIG. 3 shows an equivalent circuit of a discharge device used in an ESD test. Here, a direct current generated by a high voltage source 31 is charged in an energy storage capacitor 32 through a switch 33 and a charge resistor 34. At this time, since the switch 36 is opened, a current does not flow into the discharge resistor 35. Next, when the switch 33 is opened and the switch 36 is turned on, an electric charge stored in the energy storage capacitor 32 flows into the discharge terminal 37 through the discharge resistor 35 and the switch 36. The discharge terminal 37 comes into contact with an external object to be measured or becomes close thereto through air, such that the discharged electric charge flows into the object to be measured.

In addition, FIG. 4 shows a diagram exemplifying a value of each element used in the ESD test. In addition, in the value of each element, a value of the energy storage capacitor Cs used according to the applied test standard, and a value of the discharge resistor Rd are different from each other, and as the value of the energy storage capacitor Cs becomes large, a larger amount of energy may be applied.

Figure 5:
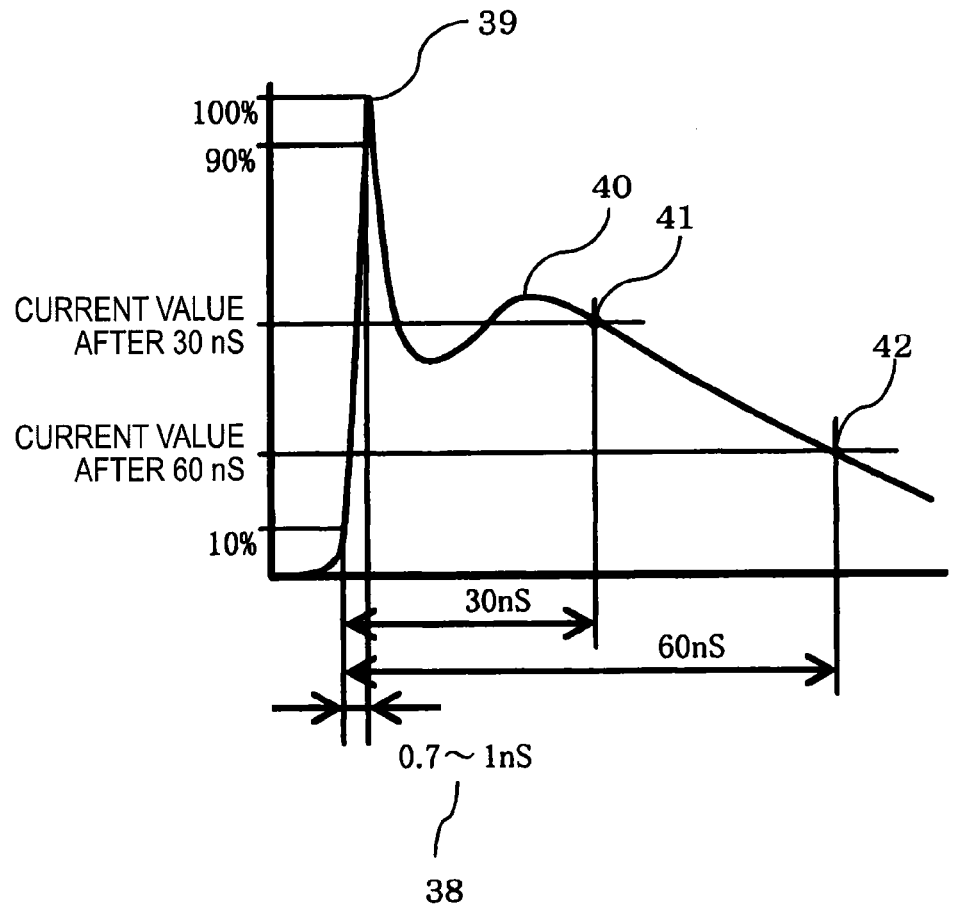
FIG. 5 is a diagram illustrating a discharge waveform in the equivalent circuit shown in FIG. 3.

Next, a discharge waveform 40 will be described with reference to FIG. 5. The horizontal axis of a graph represents a time from a discharge initiation, and the vertical axis represents a current value of a discharge current. A rising time 38 reaching a point of 90% from a point of 10% with respect to a peak value 39 of the discharge current after the current begins to flow at the time of the discharge initiation, a current value 41 of the discharge current after 30 ns from the point of 10% with respect to the peak value 39 of the discharge current, and a current value 42 of the discharge current after 60 ns from the point of 10% with respect to the peak value 39 of the discharge current are normalized.

An electrostatic pulse with such a discharge waveform 40 is applied to the first input and output terminal 1 through the transmission cable 23 and the one side external connector 21 (refer to FIG. 2).

In addition, even in a case where the electrostatic pulse is applied to the second input and output terminal 2, an operation in this case is the same as described below. Accordingly, hereinafter, description will be given only with respect to the differential transmission circuit 80 (refer to FIG. 1) in a case where the electrostatic pulse is applied to the first input and output terminal 1.

Figure 6:
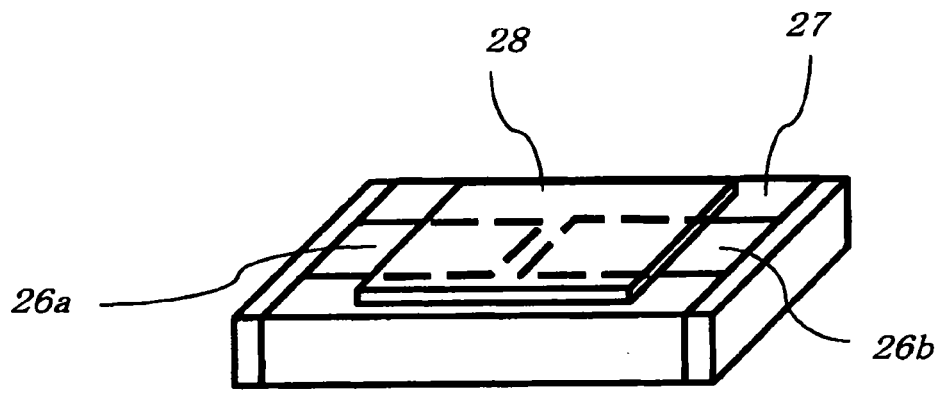
FIG. 6 is a schematic diagram illustrating the details of the structure of a first ESD protection device 5 shown in FIG. 1.

Here, as the first ESP protection element 5 shown in FIG. 1, an ESD suppressor is used. The first ESD protection element 5 has a configuration as shown in FIG. 6, and has a structure where one side electrode 26a and the other side electrode 26b on an insulating material 27 are opposite to each other in a region covered with a voltage dependent resistor 28. An input electrostatic pulse is applied to the one side electrode 26a of the first ESD protection element 5 through the first transmission line 3.

Here, the one side electrode 26a and the other side electrode 26b are opposite to each other with a significantly narrow gap of substantially 10 μm, such that when a voltage of a certain value or more is applied, discharge starts between the electrodes 26a and 26b. As a result, a current according to the electrostatic pulse flows toward a ground, and therefore a voltage sufficiently lower than the input voltage occurs at the subsequent circuit. In addition, the first ESD protection element 5 has only a significantly low electrostatic capacitance (substantially 0.1 pF), so as to have little effect on the impedance of the transmission line, and signal deterioration is also suppressed to the minimum. The electrostatic pulse suppressed at this time is shown as a waveform 44 in FIG. 7.

Figure 11:
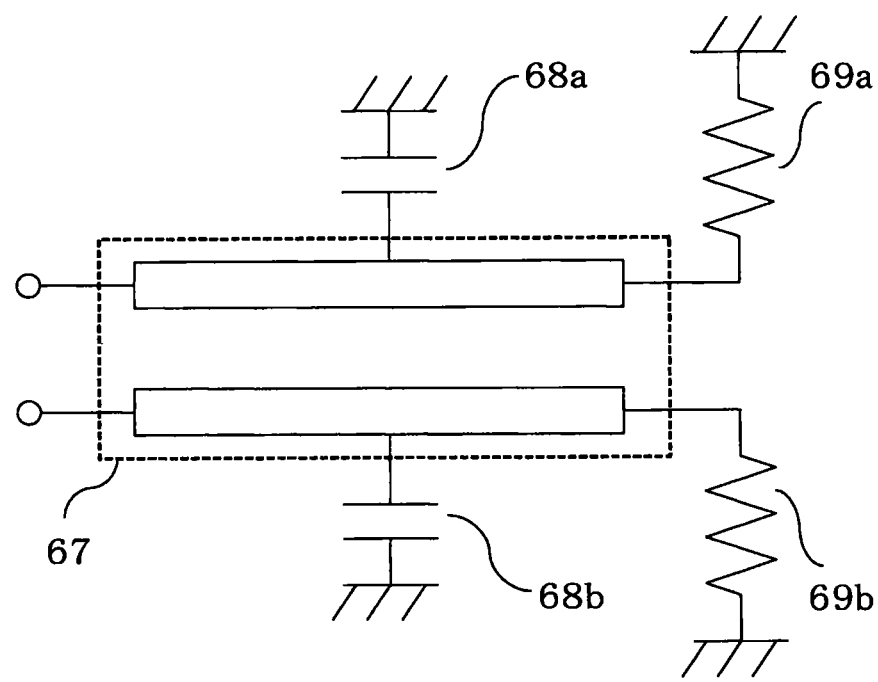
FIG. 11 is a diagram illustrating a schematic equivalent circuit when the differential transmission circuit of the invention is provided with an ESD-prevention component.

FIG. 11 shows a schematic equivalent circuit when the differential transmission circuit 67 of the invention is provided with an ESD-prevention component. In FIG. 11, the capacitors 68a and 68b show the capacitive impedance of the ESD-prevention component, and serve as a capacitor component in a state where an ESD pulse is not applied. In addition, reference numerals 69a and 69b are termination resistors of 50 ohms.

Figure 12:
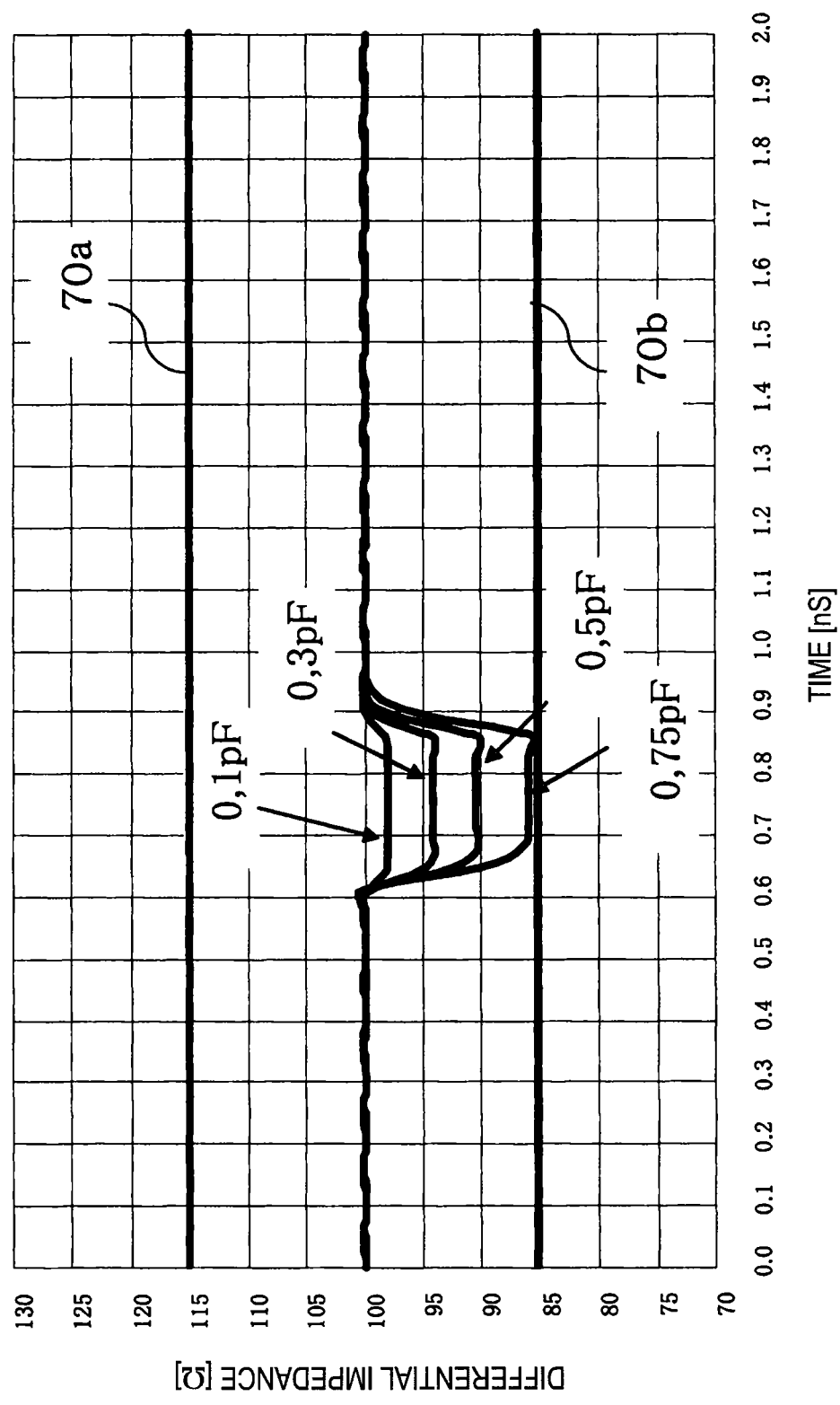
FIG. 12 is a diagram illustrating a TDR simulation waveform in a case where a capacitance value is varied in the equivalent circuit shown in FIG. 11.

In this equivalent circuit, a TDR simulation waveform in a case where the values of the capacitors 68a and 68b are varied is shown in FIG. 12. The vertical axis of FIG. 12 represents a value of differential impedance [Ω], and the horizontal axis of FIG. 12 represents time [nS]. In the drawing, a straight line 70a represents the upper limit value [Ω] of an impedance standard value of the HDMI, and a straight line 70b represents the lower limit value [Ω] of an impedance standard value of the HDMI.

In FIG. 12 shows a simulation value of a TDR waveform in a case where the total value of the capacitors 68a and 68b is varied to 0.1 pF, 0.3 pF, 0.5 pF, and 0.75 pF.

Here, since the characteristic impedance of each portion on a transmission line is shown on the time axis, the TDR waveform is a waveform seen in a direction from the external connector 21 to the load 20 of FIG. 1.

As can be seen from a simulation result shown in FIG. 12, when the applied capacitance value is less than 0.75 pF, the impedance is within a range of the upper limit 70a and the lower limit 70b of an impedance standard value of the HDMI.

However, in fact, the impedance of the transmission line formed on a printed substrate has a large variation depending on the manufacturing conditions of the printed substrate, and therefore if it is not specifically managed, it is necessary to allow a permissible value of substantially 5 to 6% with respect to a designed value. Accordingly, the permissible capacitance value satisfying the HDMI standard in an actual use is substantially 0.3 pF.

Next, the first ESD protection diode 12 of FIG. 1 will be described. A cathode and an anode of the ESD protection diode 12 are connected to the third transmission line 10 and a ground, respectively.

Here, when a voltage of a certain value or more is applied through the third transmission line 10, the impedance of the first ESD protection diode 12 quickly decreases. As a result thereof, a current according to an electrostatic pulse flows toward a ground, and in a subsequent circuit, a voltage that is sufficiently lower than the input voltage is generated.

Figure 8:
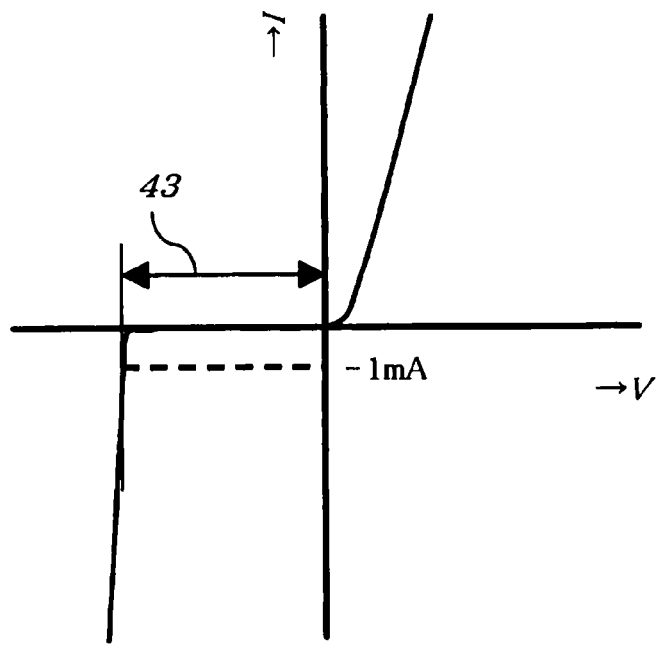
FIG. 8 is a diagram illustrating a zener voltage of the first ESD protection diode 12 shown in FIG. 1.

In regard to a threshold value (clip voltage) at this time, as indicated by "43" in FIG. 8, a point where a current of 1 mA begins to flow when a reverse bias is applied to a diode is defined as a zener voltage, such that it is necessary that this value is lower than a maximum voltage that can be input to the load (LSI) 20 (refer to FIG. 1) and is larger than the bias voltage applied to the transmission line.

In addition, in regard to the HDMI, a fixed bias of 3.3 V is applied to the transmission line, and a maximum voltage of an internal circuit of the load (LSI) 20 is generally substantially 10 V, such that it is necessary that the zener voltage of the first ESD protection diode 12 is within a range of 3.3 V to 10 V. A waveform of the electrostatic pulse suppressed at this time is shown as a waveform 45 in FIG. 7.

However, the first ESD protection diode 12 shown in FIG. 1 has an electrostatic capacitance of several pF (substantially 1 to 3 pF) between the third transmission line 10 and the ground, such that the first ESD protection diode 12 decreases the characteristic impedance of the third transmission line 10. Therefore, by disposing the first resistor 14 immediately after the first ESD protection diode 12, it is possible to prevent the decrease of the characteristic impedance. The first resistor 14 prevents the energy of the input electrostatic pulse from being transmitted to the inside of the load (LSI) 20, delays an operation initiation timing of an ESD protection circuit (not shown) embedded in the load 20, and functions to allow an internal protection element to begin to initiate an operation in a state where the electrostatic pulse is sufficiently suppressed by an external protection element, whereby impedance in the transmission line increases by the resistance value. Therefore, as described above, the first resistor 14 is disposed immediately after the first ESD protection diode 12, such that it is possible to compensate for the decrease in the impedance due to the electrostatic capacitance with the resistance value. This mechanism indicated by a waveform of a TDR (Time Domain Reflectometry) measurement is shown in FIG. 9.

Here, as described above, since characteristic impedance of each portion on a transmission line is shown on the time axis, the TDR waveform is a waveform seen in a direction from the external connector 21 to the load 20 of FIG. 1.

Figure 9:
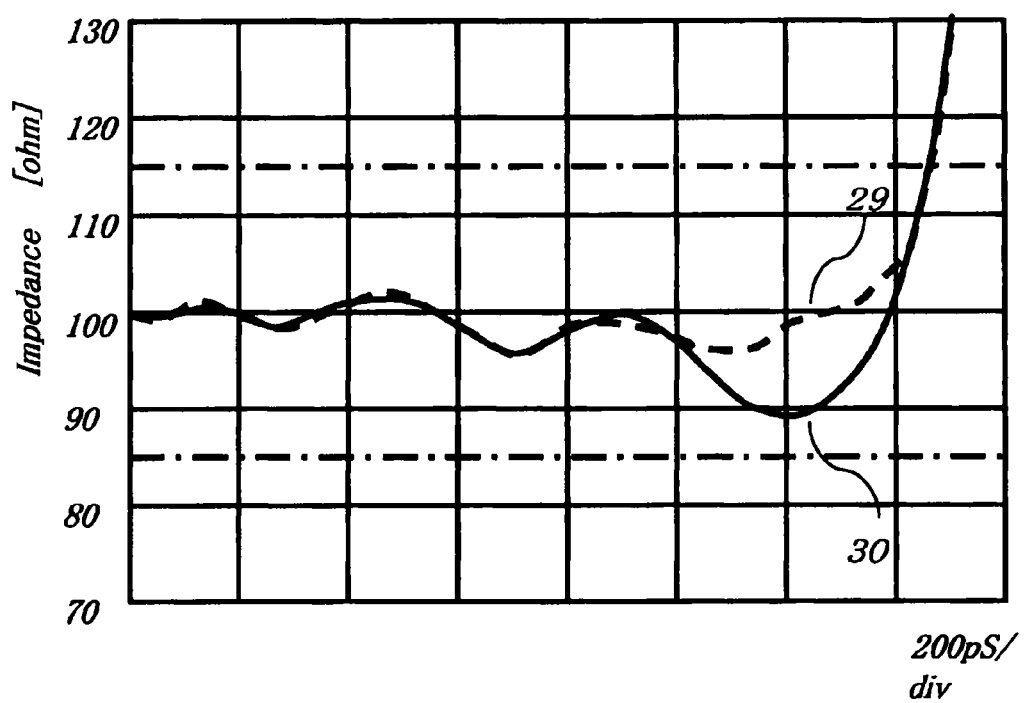
FIG. 9 is a diagram illustrating a waveform of a TDR measurement in a case where a first resistor 14 is inserted.

As can be seen from FIG. 9, compared to a TDR waveform 30 before disposing the resistor, in a TDR waveform 29 at the time of disposing the resistor, a characteristic impedance approaches 100 ohms due to the effect of the resistor, and it is possible to compensate for the deterioration due to a capacitance component of the ESD protection element such as the first ESD protection diode 12.

Figure 13:
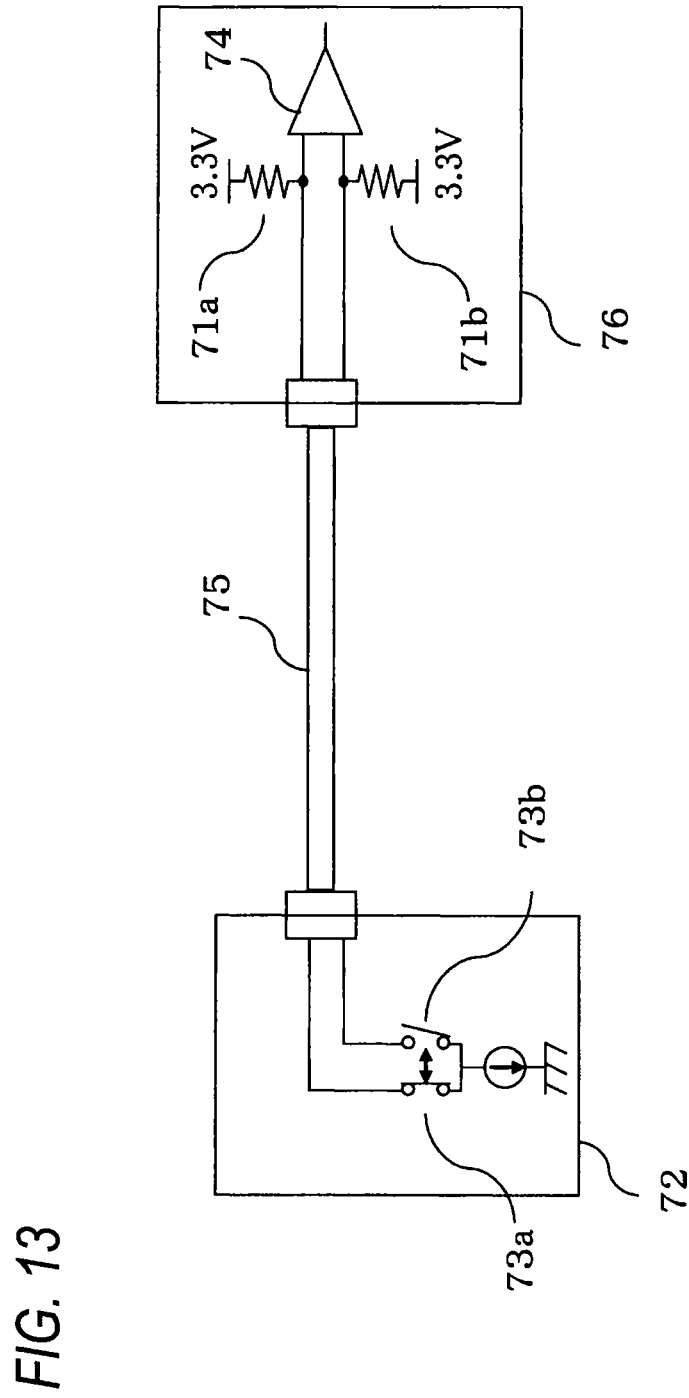
FIG. 13 is a schematic diagram illustrating a differential transmission type of an HDMI transmission apparatus and an HDMI reception apparatus.
Figure 14:
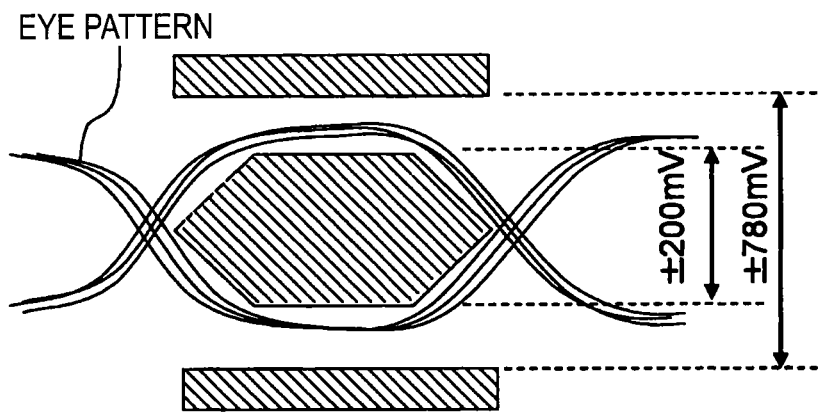
FIG. 14 is a diagram illustrating an eye pattern of a differential signal at an output terminal of the HDMI transmission apparatus.
Figure 15:
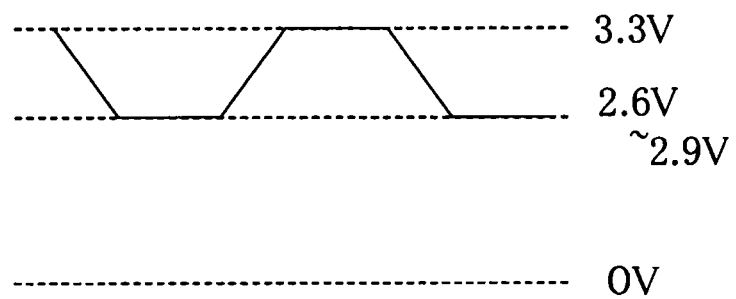
FIG. 15 is a diagram illustrating a voltage waveform of a signal end output at the output terminal of the HDMI transmission apparatus.
Figure 16:
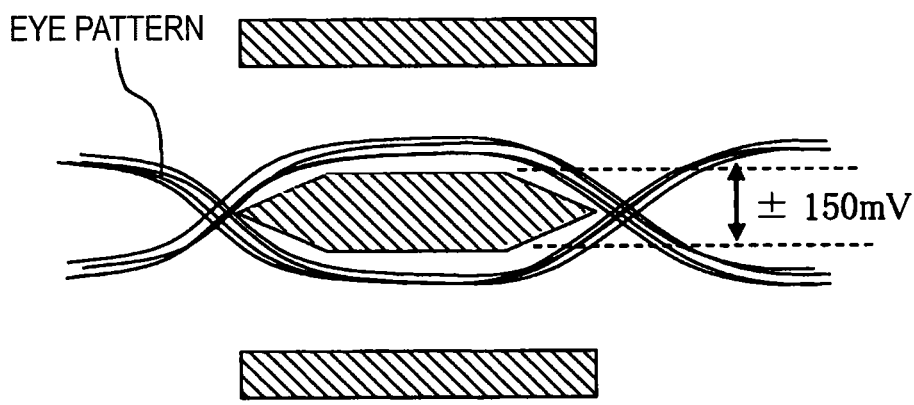
FIG. 16 is a diagram illustrating an eye pattern of a minimum voltage that is input to the HDMI reception apparatus.
Figure 17:
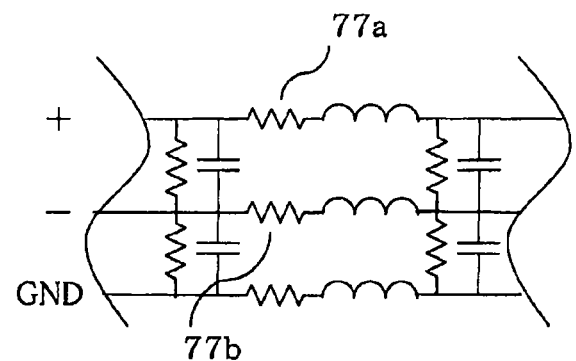
FIG. 17 is a diagram illustrating an equivalent circuit of a transmission cable according to this embodiment.
Figure 18:
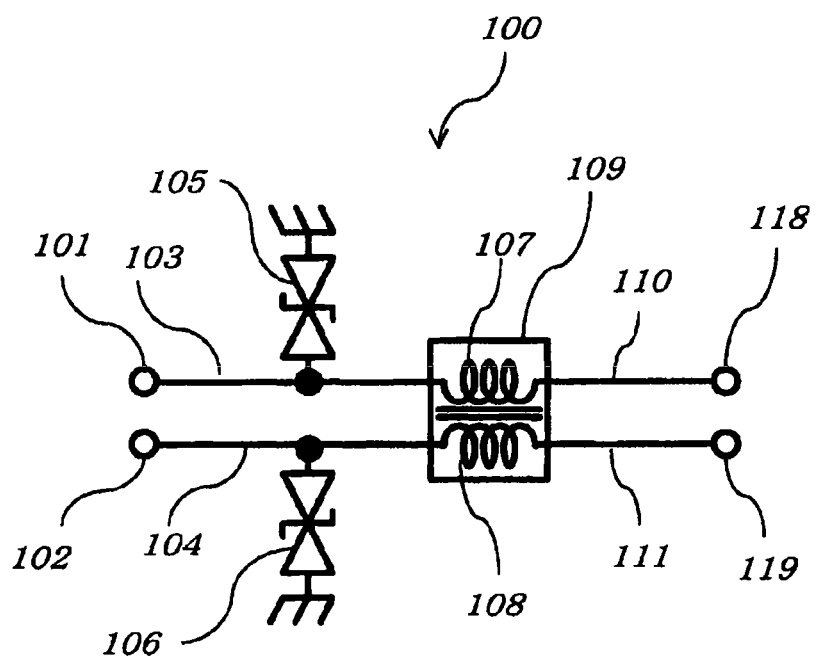
FIG. 18 is a schematic diagram illustrating a configuration of a differential transmission circuit 100 in the related art.

Here, the resistance value will be described by using FIGS. 13 to 16. FIG. 13 shows a schematic diagram illustrating a differential transmission type of an HDMI transmission apparatus and an HDMI reception apparatus. FIG. 14 shows a diagram illustrating an eye pattern of a differential signal at an output terminal of the HDMI transmission apparatus. FIG. 15 shows a diagram illustrating a voltage waveform of a signal end output at the output terminal of the HDMI transmission apparatus. FIG. 16 shows a diagram illustrating an eye pattern of a minimum voltage that is input to the HDMI reception apparatus. FIG. 17 shows a diagram illustrating an equivalent circuit of a transmission cable according to this embodiment.

As shown in FIG. 13, in a test standard of an HDMI, as a termination load of the differential transmission circuit, termination resistors 71a and 71b, which are pulled-up to a power source of 3.3 V, of 50 ohms are used.

In a transmission device 72, differential transmission circuits 73a and 73b alternately fetch a signal current through the termination resistors 71a and 71b, such that a terminal voltage of termination resistors 71a and 71b varies and a signal is input to a reception circuit 74.

According to an HDMI standard, a waveform output from the reception device 72 is determined in such a manner that a minimum value is ±200 mV or more and a maximum value is ±780 mV or less, as shown by an eye pattern of FIG. 14.

When this is considered in terms of a single end voltage, as shown in FIG. 15, it is necessary to adjust the current fetching capability of the differential transmission circuits 73a and 73b in such a manner that an L level is within a range of 2.6 to 2.9 V, which is a defined value, with a reference of the single end voltage given to 3.3 V.

On the other hand, a transmission cable 75 may be shown by an equivalent circuit as shown in FIG. 17, but as viewed from the transmission device 72, termination resistors 71a and 71b of the reception device 76 are added to series resistance components 77a and 77b in the equivalent circuit, and therefore the transmission device 72 can fetch the current through a load of relatively large value.

In addition, like this embodiment, in a case where a series resistor is disposed immediately before the reception circuit, a static electricity prevention series resistor operates in addition to the series resistance component of the transmission line, and thereby an amplitude level at a connector terminal of the transmission device 72 is suppressed, and a signal amplitude at the side of the reception device 76 may be smaller than a minimum level at which a reception is possible.

In an HDMI standard, a minimum reception level of the reception device is defined to be ±150 mV or more as shown by the eye pattern of FIG. 16, but in the case of a reception device assuming an in-vehicle device, the reception device is designed in such a manner that the reception can be accurately made even when a signal amplitude is equal to or less than ±100 mV, in consideration of an applied temperature range or the like.

This value is decreased in the amplitude by 30% with respect to 150 mV, such that when considering this in terms of an increased amount of a load resistance, 15Ω is increased. From this, in this embodiment, the upper limit of the series resistance value is set to 15 Ω.

Here, the operation of the differential transmission circuit will be given in terms of a case where the ESD suppressor, the ESD protection diodes 12 and 13, and the resistors 14 and 15 as the above-described ESD protection elements 5 and 6 are simultaneously used. As described above, the waveforms 44 and 45 of FIG. 7 are waveforms suppressed by the ESD suppressor and the ESD protection diodes. These are waveforms in a case where Cs and Rd are set to 330 pF and 2000 ohms, respectively, and an electrostatic pulse of 15 kV is applied by aerial discharge in the discharge circuit shown in FIG. 3.

Figure 7:
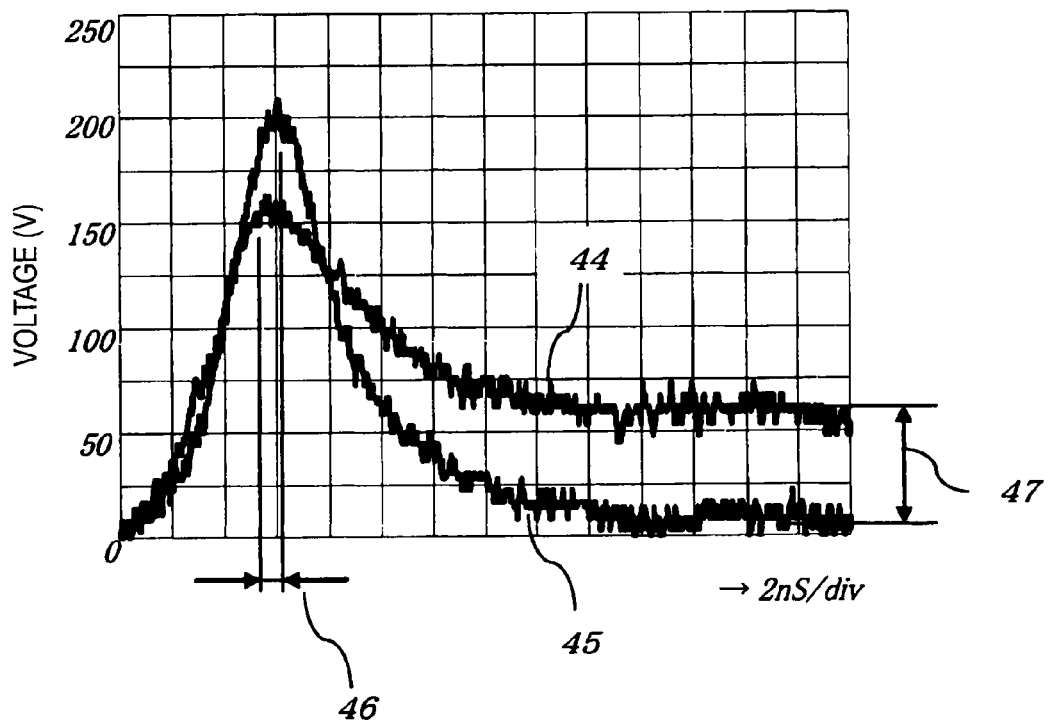
FIG. 7 is a diagram illustrating a waveform suppressed by the ESD protection elements 5 and 6, and protection diodes 12 and 13 of FIG. 1.

Here, attention needs to be given to a time difference 46 between peak points of respective waveforms of FIG. 7 and a difference 47 in clip voltages after passed the peak points. That is, in the ESD suppressor, a response is fast but the clip voltage is high, and in the ESD protection diode, the response is slow but the clip voltage is low. This difference in the response time is substantially 1 ns. In addition, the clip voltage is substantially 70 V in the ESD suppressor, and is substantially 10 V or less in the ESD protection diodes.

As can be seen from this, the ESD protection diode has an ESD suppressing effect higher than that of the ESD suppressor, and the ESD suppressor has an effect of suppressing the rising of the peak. When these elements are combined, an effect of suppressing a current flowing into LSI according to the above-described resistor is further added to the effect of the combination, it is possible to form a differential transmission circuit of a relatively high level.

Next, the common mode filter 9 shown in FIG. 1 will be described. This element is configured in such a manner that the first inductor element 7 and the second inductor element 8 are magnetically coupled to each other, and has a function of decreasing common mode noise superimposed on the differential signal. In addition, an inductance component of the first inductor element 7 and the capacitance component of the ESD protection elements connected to both ends function as a π-type low pass filter, such that there is an effect of suppressing a high frequency component of an input electrostatic pulse.

The invention is described in detail or with reference to a specific embodiment, but it should be understood by those skilled in the art that various changes or modifications may be made without departing from the spirit and scope of the invention.

This application is based on Japanese patent application No. 2009-017563 filed on Jan. 29, 2009, the content of which is incorporated hereinto by reference.

INDUSTRIAL APPLICABILITY

The differential transmission circuit according to the invention has an effect of securing a high resistance to electrostatic breakdown while suppressing the deterioration of a transmission signal in a high-speed transmission circuit to the minimum, and is effective as a differential transmission circuit adequate to a strict usage environment such as an in-vehicle device.

REFERENCE SIGNS LIST 1, 2, 18, 19: INPUT AND OUTPUT TERMINAL
3, 4, 10, 11, 16, 17: TRANSMISSION LINE
5, 6: ESD PROTECTION ELEMENT
9: COMMON MODE FILTER
12, 13: ESD PROTECTION DIODE
14, 15: RESISTOR
80: DIFFERENTIAL TRANSMISSION CIRCUIT

The invention claimed is:

1. A differential transmission circuit, comprising:
a first ESD protection element connected between a first transmission line and a ground;
a second ESD protection element connected between a second transmission line and the ground;
wherein the first and the second ESD protection element route a part of a current to the ground;
a common mode filter that includes a first inductor element and a second inductor element which are magnetically coupled to each other, wherein the first inductor element is connected in series between the first transmission and a third transmission line and the second inductor element is connected in series between the second transmission line and a fourth transmission line;
a first ESD protection diode of which a cathode is directly connected to the third transmission line and of which an anode is connected to the ground;
a second ESD protection diode of which a cathode is directly connected to the fourth transmission line and of which an anode is connected to the ground;
a first physical resistor which is connected in series between the third transmission line and a fifth transmission line; and a second physical resistor which is connected in series between the fourth transmission line and a sixth transmission line, wherein the first ESD protection diode and the second ESD protection diode bypass another part of the current to the ground; and wherein resistance values of the first and second resistors are set to 10 to 15 ohms, respectively, electrostatic capacitance values of the first and second ESD protection elements are less than 0.3 pF, respectively, and a clip voltage of each of the first and second ESD protection diodes is set to a value less than 10 V.

2. An electronic device, comprising:

a differential transmission circuit including:

a first ESD protection element connected between a first transmission line and a ground;

a second ESD protection element connected between a second transmission line and the ground;

wherein the first and the second ESD protection element route a part of a current to the ground;

a common mode filter that includes a first inductor element and a second inductor element which are magnetically coupled to each other, wherein the first inductor element is connected in series between the first transmission and a third transmission line and the second inductor element is connected in series between the second transmission line and a fourth transmission line;

a first ESD protection diode of which a cathode is directly connected to the third transmission line and of which an anode is connected to the ground;

a second ESD protection diode of which a cathode is directly connected to the fourth transmission line and of which an anode is connected to the ground;

a first physical resistor which is connected in series between the third transmission line and a fifth transmission line; and a second physical resistor which is connected in series between the fourth transmission line and a sixth transmission line, wherein the first ESD protection diode and the second ESD protection diode bypass another part of the current to the ground; and wherein resistance values of the first and second resistors are set to 10 to 15 ohms, respectively, electrostatic capacitance values of the first and second ESD protection elements are less than 0.3 pF, respectively, and a clip voltage of each of the first and second ESD protection diodes is set to a value less than 10 V.

3. The differential transmission circuit of claim 1, wherein the first ESD protection diode and the second ESD protection diode further suppress the current by bypassing the another part of the current to the ground.

* * * * *